United States Patent
Jiang et al.

(10) Patent No.: US 9,299,503 B2
(45) Date of Patent: Mar. 29, 2016

(54) RECOVERING PERFORMANCE OF DEGRADED SOLAR CELLS WITH ELECTRICAL PULSES

(71) Applicant: Wisconsin Alumni Research Foundation, Madison, WI (US)

(72) Inventors: Hongrui Jiang, Madison, WI (US); Xi Zhang, Madison, WI (US); Xuezhen Huang, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 114 days.

(21) Appl. No.: 13/785,538

(22) Filed: Mar. 5, 2013

(65) Prior Publication Data

US 2014/0251417 A1    Sep. 11, 2014

(51) Int. Cl.
*H01L 31/20* (2006.01)
*H01G 9/20* (2006.01)
*H01M 10/42* (2006.01)

(52) U.S. Cl.
CPC ............ *H01G 9/2018* (2013.01); *H01L 31/208* (2013.01); *H01M 10/4242* (2013.01); *H01G 9/2031* (2013.01); *H01G 9/2059* (2013.01); *H01L 2251/568* (2013.01); *Y02E 10/542* (2013.01)

(58) Field of Classification Search
CPC ..... H01G 9/20; H01G 9/2018; H01G 9/2031; H01G 9/2059; H01M 10/4242; H01L 31/208; H01L 2251/568; Y02E 10/542
USPC ............................................. 429/49; 320/101
See application file for complete search history.

(56) References Cited

U.S. PATENT DOCUMENTS 6,674,064 B1 * 1/2004 Chernyak et al. .......... 250/214.1
2012/0280567 A1   11/2012 Buller et al.

FOREIGN PATENT DOCUMENTS

JP        2008192441 A  *  8/2008

OTHER PUBLICATIONS

Machine Translation, JP2008-192441.*
B. O'Regan et al., "A low-cost, high-efficiency solar cell based on dye-sensitized colloidal TiO2 filsm", Nature, Vo. 353, Oct. 24, 1991, pp. 737-740.
Y. Chiba et al., "Dye-Sensitizied Solar Cells with Conversion Efficiency of 11.1%", Japanese Journal of Applied Physics, vol. 45, No. 25, 2006, pp. L638-L640.
Q. Yu et al., "High-Efficiency Dye-Sensitized Solar Cells: The Influence of Lithium Ions on Exciton Dissociation, Charge Recombination, and Surface StatesS", ACSNANO, vol. 4, No. 10, pp. 6032-6038, 2010.
A, Yella et al., "Porphyrin-Sensitized Solar Cells with Cobalt (II/III)-Based Redox Electrolyte Exceed 12 Percent Efficiency", Science 334, 629, 2011.

(Continued)

*Primary Examiner* — Marla D McConnell
(74) *Attorney, Agent, or Firm* — Boyle Fredrickson, S.C.

(57) ABSTRACT

A system and method for recovering performance of a degraded solar cell are provided. The system includes a solar cell having electrodes arranged on opposing sides of an electrolyte and defining a solar cell polarity therebetween and a power source connected to the electrodes. A controller controls the power source for applying a voltage pulse(s) across the solar cell. The voltage pulse may be applied at the solar cell polarity so as to define a forward electrical bias of the solar cell.

6 Claims, 4 Drawing Sheets

(56) References Cited

OTHER PUBLICATIONS

K. Tennakone et al., "Dye-sensitized sold state photovoltaic cell based on composite zinc oxide/tin (IV) oxide films", J. Phys. D: Appl. Phys. 32 (1999) 374-379.

Q. B. Meng et al., "Fabrication of an Efficient Solid-State Dye-Sensitized Solar Cell", Langmuir 2003, 19, 3572-3574.

I. Chung et al., "All-solid-state dye-sensitized solar cells with high efficiency", Nature, vol. 485, May 24, 2012, pp. 486-490.

U. Bach et al., "Solid-state dye-sensitized mesoporous TiO2 solar cells with hihg photon-to-electron conversion efficiencies", Nature, vol. 395. Oct. 8, 1998, pp. 583-585.

Y. Saito et al., "Solid state dye sensitized solar cells using in situ polymerized PEDOTs as hole conductor", Electrochemistry Communications 6 (2004) 71-74.

N. Hirata et al., "Interface engineering for solid-state dye-sensitised nanocrystalline solar cells: the use of an organic redox cascade", Chem. Commun. 2006, 535-537.

H. Wang et al., Novel Ester-Functionalized Solid-State Electrolyte for Highly Efficient All-Solid-State Dye-Sensitized Solar Cells., Adv. Mater, 2012, 24, 121-124.

T. Stergiopoulos et al., "Binary Polyethylene Oxide/Titania Solid-State Redox Electrolyte for Highly Efficient Nanocrystalline TiO2 Photoelectrochemical Cells", Nano Letters, 2002, vol. 2, No. 11, pp. 1259-1261.

M. Kaneko et al., "Dye-sensitized Solar Cell with Polysaccharide Solid Electrolyte", Chermisty Letters, vol. 32, No. 9, 2003, pp. 872-873.

L. Wang et al., "A 7.72% efficient dye sensitized solar cell based on novel necklace-like polymer gel electrolyte containing latent chemically cross-linked gel electrolyte precursors", Chem. commun., 2005, pp. 5687-5689.

P. Wang et al., "A stable quasi-solid dye-sensitized solar cell with an amphiphilic ruthenium sensitizer and polymer gel electrolyte"; Nature Materials, vol. 2, Jun. 2003, pp. 402-407 and 498.

J.H. Kim et al., "Dye-sensitized nanocrystalline solar cells based on composite polymer electrolytes containing fumed silica nanoparticles", Chem. Comm., 2004, pp. 1662-1663.

J.H. Wu et al., "A Thermoplastic Gel Electrolyte for Stable Quasi-Solid-State Dye-Sensitized Solar Cells", Adv. Funct. Mater. 2007, 17, pp. 2645-2652.

Q. Li et al., "Application of poly(acrylic acid-g-gelatin)/polypyrrole gel electrolyte in flexible quasi-solid-state dye-sensitized solar cell", Electrochimica Acta 55 (2010), pp. 2777-2781.

K. Fan et al., "Low-cost, quasi-solid-state and TCO-free highly bendable dye-sensitizied cells on paper substrate", J. Mater. Chem., 2012, 22, 16121.

K. Zhu et al., "Impact of High Charge-Collection Efficiencies and Dark Energy-Loss Processes on Transport, Recombination, and Photovoltaic Properties of Dye-Sensitzed Solar Cells", J. Phys. Chem. Lett. 2011, 2, pp. 1070-1076.

Y. Yang et al., "Improved stability of quasi-solid-state dye-sensitized solar cell based on poly (ethylene oxide)-poly (vinylidene fluoride) polymer-blend electrolytes", Journal of Power Sources 185 (2008, pp. 1492-1498.

A. Hagfeldt et al., "Dye-Sensitized Solar Cells", Chem. Rev. 2010, 110, pp. 6595-6663.

L.Y. Han et al., "Modeling of an equivalent circuit for dye-sensitized solar cells", Applied Physics Letters 84, 2433 (2004).

Q. Wang et al., "Electrochemical Impedance Spectroscopic Analysis of Dye-Sensitized Solar Cells", J. Phys. Chem. B 2005, 109, 14945-14953.

* cited by examiner

RECOVERING PERFORMANCE OF DEGRADED SOLAR CELLS WITH ELECTRICAL PULSES

REFERENCE TO GOVERNMENT GRANT

This invention was made with government support under OD008678 awarded by the National Institutes of Health. The government has certain rights in the invention.

FIELD OF THE INVENTION

The invention relates generally to solar-to-electric conversion efficiency and, in particular, to recovering performance of degraded solar cells such as quasi-solid-state and solid-state dye-sensitized solar cells (DSSCs).

BACKGROUND AND SUMMARY OF THE INVENTION

Converting solar energy to electric power holds great promise as a renewable clean energy source. DSSCs have attracted tremendous attention in recent years because of their low cost and high efficiency. The DSSCs with the highest power conversion efficiency are based on liquid electrolytes, with a reported efficiency of over 12%. However, liquid electrolytes limit the long-term stability of DSSCs as leakage and solvent evaporation may occur. Efforts have been made to replace the liquid electrolytes with solid-state materials, including inorganic hole conductors/p-type semiconductors, organic hole conductors, nano-composite materials, and gel and polymer electrolytes. Among these materials, polymer electrolytes are of interest for practical applications owing to their excellent characteristics such as easy fabrication, low cost, good stability, and flexibility. However, after cells made from such materials degrade, power conversion efficiency values of the cells remain compromised.

Therefore, it is a primary object and feature of the present invention to provide a system and/or method for recovering performance of degraded solar cells.

It is a further object and feature of the present invention to provide a system and/or method for recovering performance of degraded dye-sensitized solar cells that can be performed on-site without removing the degraded dye-sensitized solar cells from a solar power system.

It is a still further object and feature of the present invention to provide a system that improves the performance of a degraded solar cell by applying at least one voltage pulse across the solar cell.

In accordance with the present invention, a method of recovering performance of a degraded solar cell is provided. The method includes connecting a power source to first and second electrodes of a solar cell. A first voltage pulse is applied with the power source across the solar cell so as to provide a forward electrical bias of the solar cell.

In accordance with another aspect of the invention, the forward electrical bias may include applying a second or more voltage pulse(s) spaced in time from the first voltage pulse. An electrolyte of the solar cell has ion transport channels defined therein. Electrons may be injected into the electrolyte for redistributing ions within the electrolyte so as to improve a flow characteristic through the ion transport channels.

In accordance with another aspect of the invention, the method includes converting solar energy to electrical energy in a solar cell having a first electrode and a second electrode arranged on opposing sides of an electrolyte. A solar cell polarity is defined between the electrodes during use corresponding to a voltage defined across the solar cell during use. A concentration of ions in the electrolyte is established corresponding to a degraded performance state of the solar cell having a first value of power conversion efficiency. In the degraded performance state, the solar cell is relatively less efficient and provides relatively lower photocurrent values than a solar cell with an undegraded performance state such as a newly manufactured solar cell. A power source is connected to the first and second electrodes and a voltage pulse(s) is applied with the power source across the solar cell. The voltage pulse(s) may be provided at the solar cell polarity, to provide a forward electrical bias of the solar cell so as to inject electrons into the electrolyte during application of the voltage pulse. The electrons may be injected through the photoelectrode, into the electrolyte. This may be done by injecting electrons from the conduction band of the photoelectrode to the redox level of the electrolyte. Ions may be redistributed in the electrolyte. This may be done by changing the concentration of ions in the electrolyte or attenuating some other blocking or flow restricting mechanism that is compromising performance of the degraded solar cell 14, which may open previously blocked ion transport channels. Opening the previously blocked ion transport channels may improve performance of the degraded solar cell, providing a recovered performance state having a second value of power conversion efficiency that is relatively higher than the first, degraded, value of power conversion efficiency. This may allow for recovering performance of degraded solar cells.

In accordance with another aspect of the invention, each voltage pulse may be between about 2 V and 3 V, such as about 2.5 V, and have a duration of between about 150 ms and 200 ms, such as about 185 ms, or other suitable voltage magnitudes and durations. This may provide pulse shapes that correspond to a rectangular wave form. The forward electrical bias may include applying multiple voltage pulses that are spaced from each other. The multiple voltage pulses may be provided as a double pulse delivery, a series of double pulses, or three or more pulses that have delivery times that are generally equally spaced from each other. Delivery of the pulses within the double pulses may be spaced from each other by a time period of between about 1 and 3 seconds, such as about 2 seconds, or other suitable time period. In this way, an integral value of a function that is represented in a voltage pulse graph showing the pulse(s) may correspond to an acceptable value of stimulus for recovering the degraded solar cell by forward electrical biasing. This may allow for injecting electrons in a manner that redistributes ions in the electrolyte in a highly controlled manner so as to avoid pulse-induced dark currents that are too large for maintaining the integrity of the solar cell.

In accordance with another aspect of the invention, an ion-related value may be determined that corresponds to a number of ions in the electrolyte. Based at least in part on the determined ion-related value, an electron-related value may be determined that corresponds to a number of electrons to be injected into the electrolyte during application of the voltage pulse. Based on such determined ion- and electron-related values, a number of electrons may be injected into the electrolyte with the voltage pulse(s) during the forward electrical biasing of the solar cell. The number of electrons may be no more than about the number of ions in the electrolyte. This may help maintain the integrity of the solar cell turning the forward electrical biasing of the solar cell.

In accordance with another aspect of the invention, a system for recovering performance of a degraded solar cell is provided that includes a solar cell defining a first electrode and a second electrode arranged on opposing sides of an electrolyte and defining a solar cell polarity therebetween during use. A power source is operably connected to the first and second electrodes. A controller is operably connected to the power source for controlling the power source to apply a voltage pulse across the solar cell at the solar cell polarity which may redistribute ions in electrolyte for improving the power conversion efficiency of the solar cell.

In accordance with another aspect of the invention, the solar cell may be a dye-sensitized solar cell with a non-liquid electrolyte. The electrolyte may be made from a solid-state material which may include a polymeric material. The electrolyte may be made from a quasi-solid-state material which may include a gel that may include a polymeric material. The polymeric material may be polyvinylidene fluoride.

BRIEF DESCRIPTION OF THE DRAWINGS

The drawings furnished herewith illustrate a preferred construction of the present invention in which the above advantages and features are clearly disclosed as well as others that will be readily understood from the following description of the illustrated embodiment.

In the drawings.

DETAILED DESCRIPTION OF THE DRAWINGS

Figure 1:
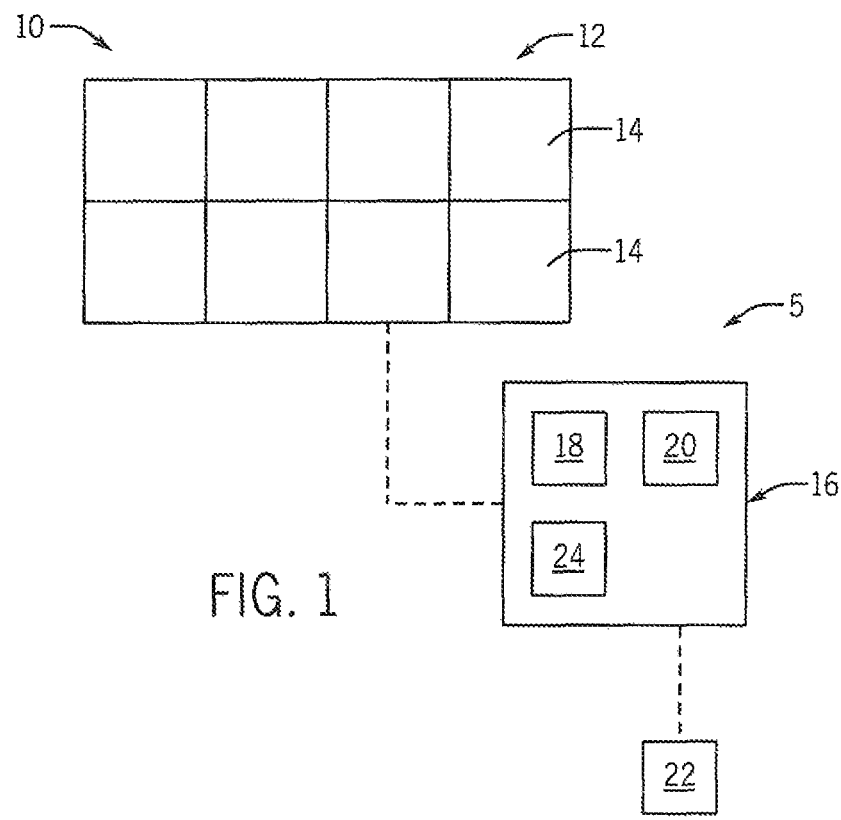
FIG. 1 is a schematic representation of a system for recovering performance of a degraded solar cell in a solar power system in accordance with the present invention.

Referring to FIG. 1, a system for recovering performance of a degraded solar cell, shown as system 5, is shown being used with a solar power system 10. The solar power system 10 includes a panel 12 having at least one solar cell 14 for solar-to-electric conversion. System 5 is shown as including a control system 16 having a controller 18 and may have an inverter 20 that are operably connected to each other and the panel 12 for delivering electrical power generated by the panel 12 to a power-consuming device 22. The control system 16 also includes a power source 24 such as a Keithley 2400 source meter that is operably connected to the controller 18 and the solar cells 14 of the panel 12 for recovering performance of degraded solar cells 14, as described in greater detail elsewhere herein.

Figure 2:
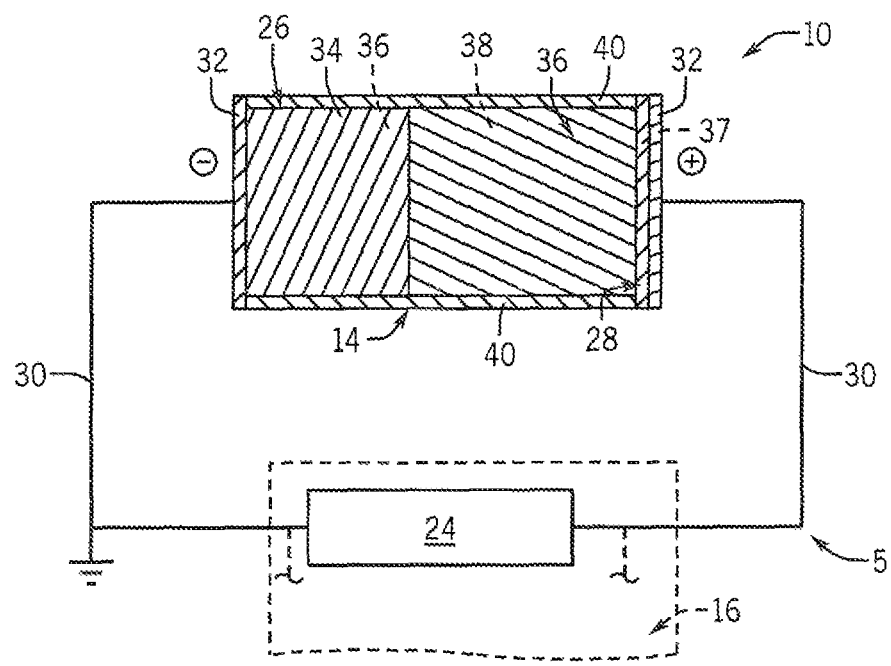
FIG. 2 is a close-up schematic representation of portions of the system for recovering performance of a degraded solar cell of FIG. 1.

Referring now to FIG. 2 which provides a schematic representation of one of the solar cells 14 with the system 5, the solar cell 14 is shown as a dye-sensitized solar cell. The solar cell 14 includes first and second electrodes 26, 28 that are operably connected to the control system 16, including the power source 24, by way of conductors 30 for delivering power to the power-consuming device 22 and allowing system 5 to recover performance of a solar cell 14 that is in a degraded state. As shown in this embodiment, the first electrode 26 is shown as a negative terminal which, in this exemplary embodiment, has a zero potential because it is grounded. The second electrode 28 is shown as a positive terminal and thus has a positive potential such that, during use, electrons flow from the first electrode 26 toward the second electrode 28. This defines a corresponding solar cell polarity of the solar cell 14.

Still referring to FIG. 2, the first electrode 26 is shown as a photoelectrode having a substrate 32 and a film 34 that covers at least a surface of the substrate 32 facing inwardly into the solar cell 14. The substrate 32 may be made from a conductive fluorine-doped tin oxide (FTO) glass material. The film 34 may be defined by a matrix of a porous material that is treated with dye and has pores that are filled with an electrolyte 36 that also fills a cavity 38 between the first and second electrodes 26, 28. In one embodiment, the film 34 is defined by a titanium dioxide ($TiO_2$) film deposited onto the substrate 32 by a screen printing method. During the screen printing method, a paste having $TiO_2$ particles, which may be about 15-20 nm in size, may be deposited onto the substrate 32. Suitable sintering procedures may be performed along with dipping the $TiO_2$ treated substrate 32 in a titanium tetrachloride ($TiCl_4$) aqueous solution, followed by calcinations to stain the $TiO_2$ film as a pretreatment that is then soaked in a dye solution. The dye solution may be an acetonitrile/tertbutanol dye solution, such as 0.3 mM N719 in acetonitrile/tertbutanol, v/v=1:1 to provide the dye-sensitized $TiO_2$ film of film 34 that defines the porous material that has its pores occupied, for example, fully filled, by some of the electrolyte 36 that extends into interstices of the porous material to fill its pores. This provides an arrangement of the film 34 that includes dye-loaded $TiO_2$ nanoparticles surrounded by electrolyte 36.

Still referring to FIG. 2, the electrolyte 36 is a redox electrolyte that may be made from a solid state material or a quasi solid state material such as a gel and that may be made from or include a polymeric material. The polymeric material may be polyvinylidene fluoride (PVDF). In one embodiment, the electrolyte 36 is made from a solution having 0.1 M LiI, 0.05 M $I_2$, 0.6 M 1,2-dimethyl-3-propylimidazolium iodide, and 2 wt % PVDF (Kynar 301F, Mw=$3.8 \times 10^5$), using acetonitrile/dimethyl sulfoxide (v:v=4:1) as solvent. Such solution may be injected into the cavity 38 until both the cavity 38 and the pores of the film 34 have been filled and then dried until the solvent is sufficiently removed so as to provide the electrolyte 36 with a quasi solid state form.

Still referring to FIG. 2, the second electrode 28 is shown as a counter electrode on an opposing side of the electrolyte 36 from the first electrode 26. In one embodiment, the second electrode 28 is defined by a platinum coating 37 that is coated onto a substrate 32 that may be made from a conductive FTO glass material like the substrate 32 described with respect to the first electrode 26. The platinum coating 37 that defines the second electrode 28 may be deposited on the substrate 32 by way of an electrodeposition process in chloroplatinic acid ($H_2PtCl_6$) solution. The second electrode 28 is arranged to face inwardly into the solar cell 14, interfacing with the electrolyte 36. Spacers 40, which may be made from a resinous material such as Surlyn®, extend between the first and second electrodes 26, 28 to provide insulation and maintain spacing within the solar cell 14.

Figure 3:
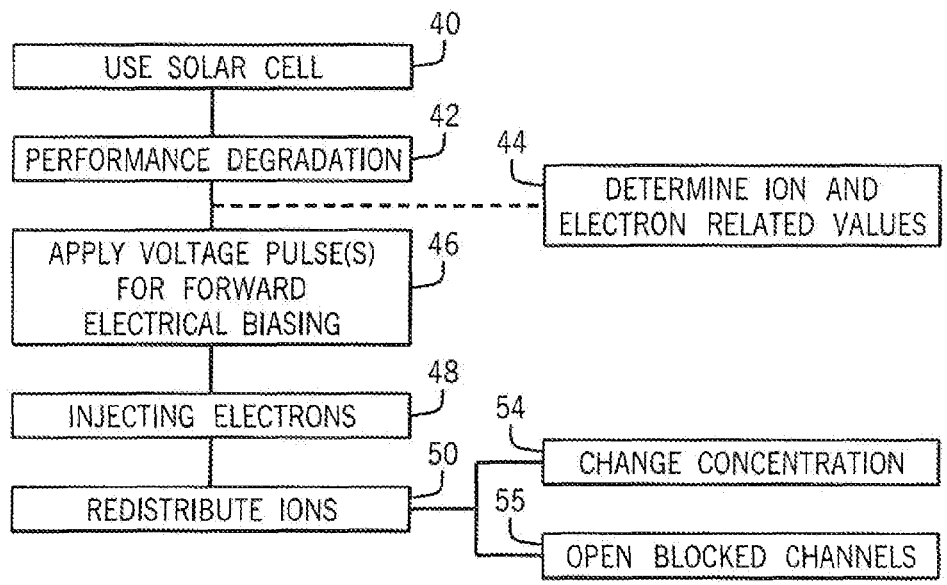
FIG. 3 is a flowchart of a process for recovering performance of a degraded solar cell.

Referring now to FIG. 3 and with further reference to FIG. 2, a procedure is shown for recovering performance of degraded solar cells 14 that define a degraded performance state. As represented at blocks 40 and 42, a solar cell 14 is used, and, over time, its performance degrades so that the solar cell 14 defines a degraded performance state. In the degraded performance state, the solar cell 14 is relatively less efficient and provides relatively lower photocurrent values than a solar cell with an undegraded performance state such as a newly manufactured solar cell. As represented at block 44, a determination of a suitable recovery stimulus can be made which may include an assessment of the solar cell 14, and possible recovery stimulus such as determining an ion-related value that may correspond to a number of ions in the electrolyte 36. Based at least in part on the determined ion-related value, an electron-related value may be determined that corresponds to a number of electrons that can be injected into the electrolyte 36, as explained in greater detail elsewhere herein. In one embodiment, the number of electrons to be injected may be no more than about the number of ions in the electrolyte, such as no more than a total number of ions in the electrolyte 36 or no more than a number of one type of a particular ion in the electrolyte 36, or a predetermined ratio of electrons to total or one type of ion in the electrolyte 36.

Figure 4:
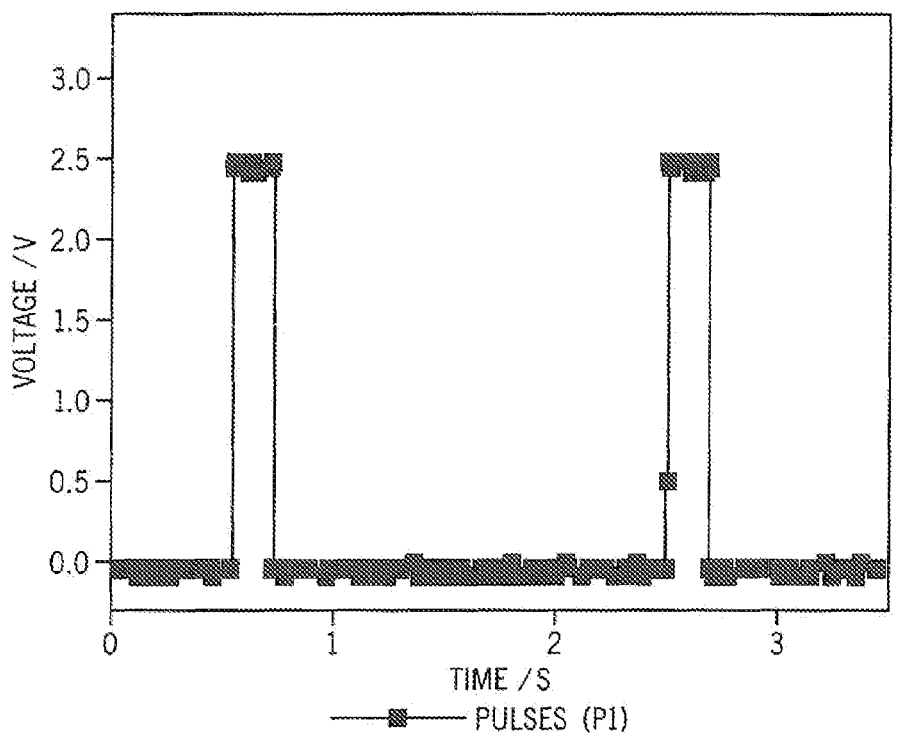
FIG. 4 is a graph showing voltage versus time during application of voltage pulses.

Still referring to FIG. 3 and with further reference to FIG. 4, as represented at block 46, the power source 24 (FIG. 2) may apply a voltage pulse(s) across the solar cell 14 (FIG. 2). The pulse characteristics of the voltage pulse(s) may be selected based at least in part on the determined ion-related and/or electron-related values. The voltage pulse(s) may be applied at the solar cell polarity so as to apply forward electrical bias to the solar cell 14. FIG. 4 is a graph showing voltage versus time of one embodiment of a suitable application of voltage pulses to provide a forward electrical biasing of the solar cell 14. Each voltage pulse of this double-pulse embodiment is between about 2 V and 3 V, such as about 2.5 V, and has a duration of between about 150 ms and 200 ms, such as about 185 ms, providing pulse shapes that correspond to a rectangular wave form. The voltage pulses are spaced from each other by a time period of between about 1 and 3 seconds, such as about 2 seconds. In this way, an integral value of a function that is represented in the voltage pulse graph may correspond to an acceptable value of stimulus for recovering the degraded solar cell 14 by forward electrical biasing.

Still referring to FIG. 3 as represented at block 48, during application of the voltage pulse(s) electrons may be injected through the first electrode 26, into the electrolyte 36, such as by injecting electrons from the conduction band of the first electrode 26 to the redox level of the electrolyte 36. Still referring to FIG. 3 and with further reference to FIGS. 5-9, as represented at block 50 (FIG. 3), ions 52 may be redistributed in the electrolyte. In this embodiment, ions 52 include I$^-$ ions 52A and I$_3^-$ ions 52B.

Figure 5:
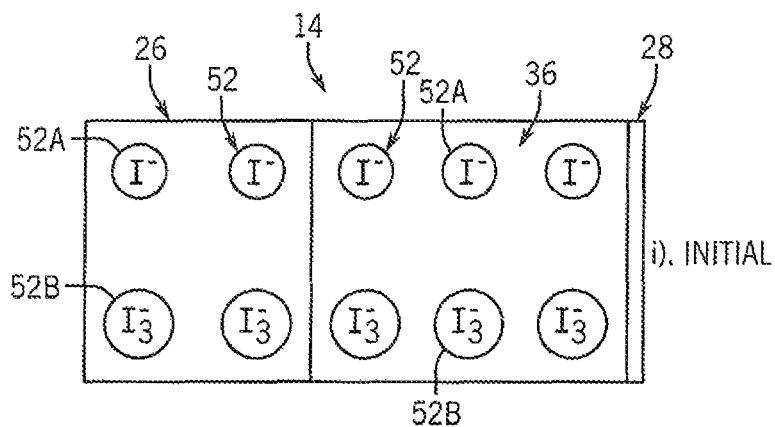
FIG. 5 is a schematic representation of a solar cell in an equilibrium state.
Figure 6:
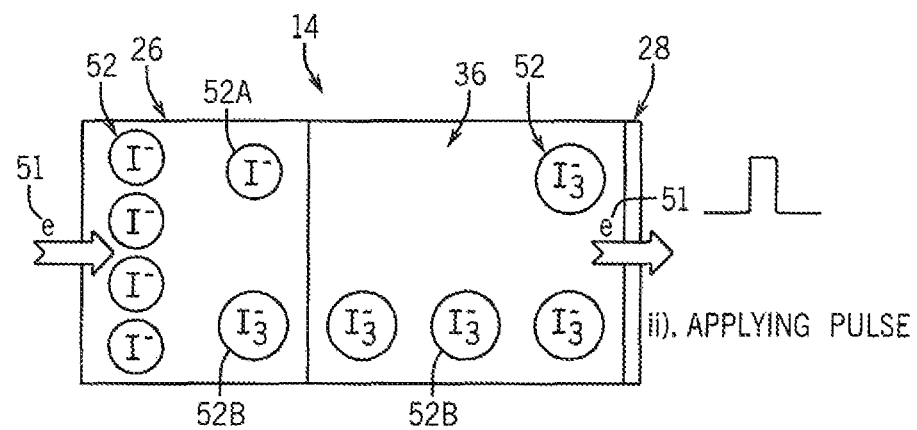
FIG. 6 is a schematic representation of the solar cell of FIG. 5 during application of a voltage pulse.
Figure 7:
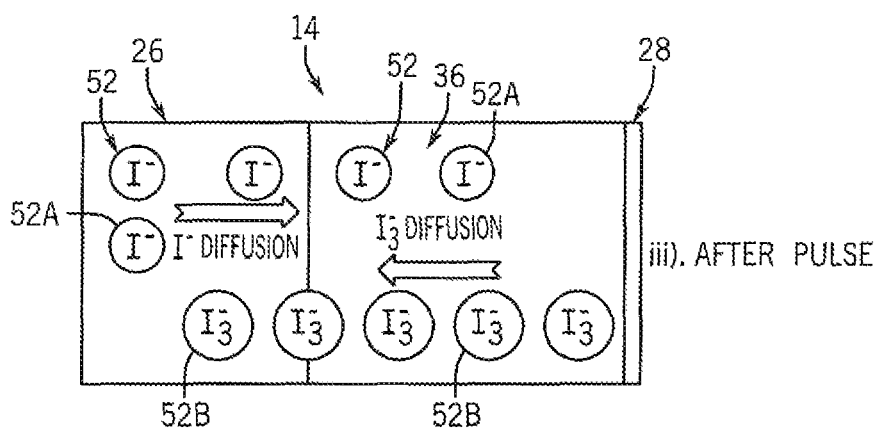
FIG. 7 is a schematic representation of the solar cell of FIG. 5 in a non-equilibrium state after application of a voltage pulse.

Still referring to FIG. 3 and with further reference to FIGS. 5-7, as represented at block 54 (FIG. 3), redistributing ions 52 may change the concentration of the ions 52 in a manner that improves performance of the degraded solar cell 14. FIG. 5 schematically shows a concentration of ions 52 in a solar cell 14 in an equilibrium state. FIG. 6 schematically shows injection of electrons 51 during application of the voltage pulse(s) to apply the forward electrical bias to the solar cell 14. This is done by applying a voltage pulse(s) with the same polarity as the solar cell polarity, in which the first electrode 26 is a photoelectrode with a zero potential and the second electrode 28 is a counter electrode with positive potential. This injects electrons 51 from the conduction band of the first electrode 26 to the redox level of the electrolyte 36. The following reaction then occurs at a TiO$_2$/dye/electrolyte interface of the first electrode 26:

$$I_3^- + 2e(TiO_2) \rightarrow 3I^-$$    Equation (1)

During this reaction, plenty of I$^-$ ions 52A are produced near the TiO$_2$/dye/electrolyte interface of the first electrode 26. Meanwhile, I$_3^-$ ions 52B in the same amount are produced in the electrolyte 36 near the counter electrode defined by the second electrode 28 via a reverse reaction of Equation (1), as shown in FIG. 6. The net effect of the voltage pulse(s) is therefore the increased concentration of I$^-$ ions 52A near the photoelectrode defined by the first electrode 26, while the concentration of I$_3^-$ ions 52B near the counter electrode defined by the second electrode 28 is increased. As shown in FIG. 7, after the voltage pulse(s), the concentration gradient drives the ions 52 to diffuse back to the initial equilibrium. At this point, the solar cell 14 defines an improved performance state and has a second value of power conversion efficiency that is relatively higher and allows for a higher photocurrent value than the first value of power conversion efficiency of the first state of the solar cell 14. In a degraded solar cell 14, the voltage pulse(s) enhances efficiency instantly and such improved efficiency lasts for a period of time, defining a recovery period which in some embodiments lasts for weeks such as at least about 30 days after application of the voltage pulse(s). In contrast, in a non-degraded solar cell 14, the efficiency may also be enhanced instantaneously; however the period of improved efficiency may also fall back to the original value instantaneously so as to not define an enhanced performance period beyond a nominal period of time after application of the voltage pulse(s).

Figure 8:
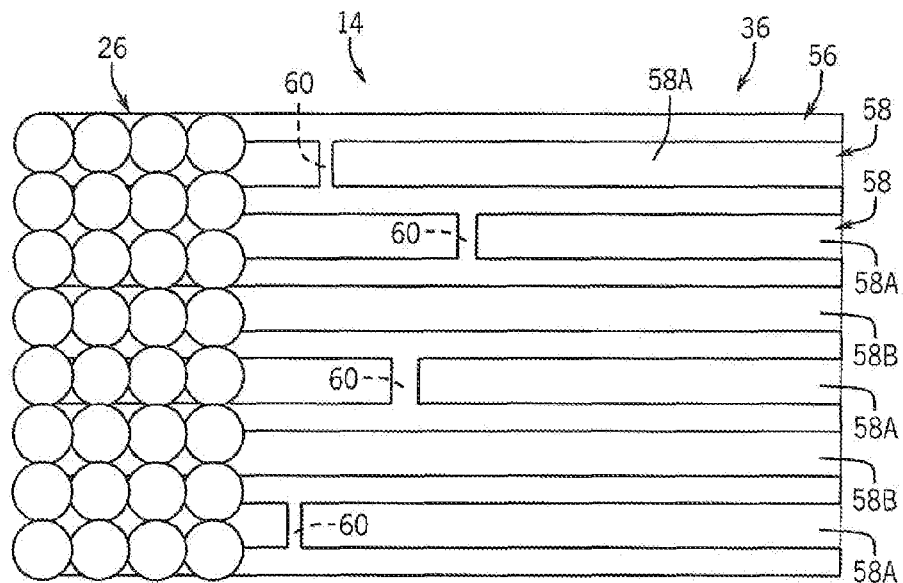
FIG. 8 is a schematic representation of a solar cell in a degraded state.
Figure 9:
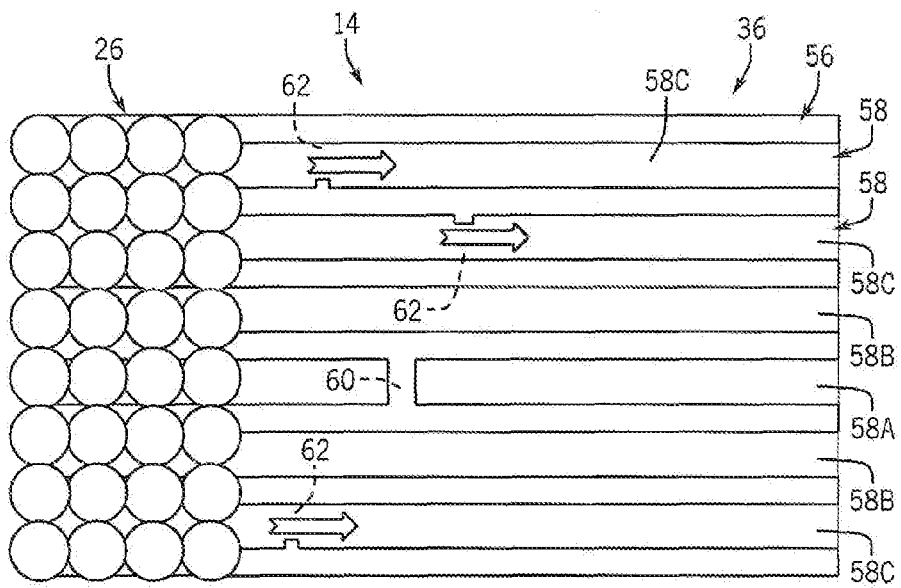
FIG. 9 is a schematic representation of a solar cell in a recovered state.

Still referring to FIG. 3 and with further reference to FIGS. 8-9, as represented at block 55 (FIG. 3), redistributing ions 52 may mitigate or attenuate the particular blocking or flow restricting mechanism that is compromising performance of the degraded solar cell 14, which may improve performance of the degraded solar cell 14. FIG. 8 schematically shows a degraded solar cell 14, such that the solar cell 14 defines a degraded performance state and the first value of power conversion efficiency that is relatively less efficient as described above with respect to the solar cell of FIG. 5. Within the electrolyte 36, material(s) of the solid electrolyte defines a framework 56 having ion-transport channels 58 for transport of the ions 52. The ion-transport channels 58 include blocked channels 58A and unblocked channels 58B. The blocked channels 58A may have their flow characteristic(s) compromised in any of a variety of ways, including, but not limited to, physical blockage such as by materials or ions, restriction of the channel itself such as by shrinking or collapsing of the channel 58A, ion accumulation-related restrictions such as accumulations which may influence a change in the distribution of the electrical field that blocks the further movement of the ions, and/or other blocking or flow restriction mechanisms. Such blocking or flow restriction mechanisms are schematically shown as restrictions 60. The unblocked channels 58B have an improved flow characteristic and are generally not flow restricted, allowing for ion transport therethrough and thus allowing photocurrent through the unblocked channels 58B of the solar cell 14. FIG. 9 schematically shows a degraded solar cell 14 that had its performance recovered by way of the voltage pulse(s), whereby the solar cell 14 defines a recovered performance state. By applying the voltage pulse(s), some of the ion-transport channels 58 that were previously blocked have been opened, defining opened channels 58C. The opened channels 58C permit flow through the ion-transport channels 58 and thus allowing photocurrent through opened channels 58C in addition to that through the unblocked channels 58B of the solar cell 14. This is schematically shown as openings 62, representing restrictions 60 from FIG. 8 that have been attenuated by the voltage pulse(s). In this way, the solar cell 14, in its recovered performance state, may provide a second value of power conversion efficiency that is relatively more efficient and allows for a higher photocurrent value than the first value of power conversion efficiency of the degraded state of the solar cell 14.

Various modes of carrying out the invention are contemplated as being within the scope of the following claims particularly pointing out and distinctly claiming the subject matter which is regarded as the invention.

We claim:

1. A method of recovering performance of a degraded solar cell having first and second electrodes defining a solar cell polarity therebetween, the degraded solar cell having ions accumulated in an electrolyte of the solar cell so as to block ion transport channels of the electrolyte, comprising:
   connecting a power source to the first and second electrodes; and
   sequentially applying a series of voltage pulses with the power source across the solar cell at the solar cell polarity providing a forward electrical bias of the solar cell, each voltage pulse:
   spaced from an adjacent voltage pulse by a time period, the time period being in a range of 1 second to 3 seconds; and
   defined by a pulse height of between about 2 V and 3 V and a pulse width of between about 150 ms and 200 ms.

2. The method of claim 1 further comprising the step of injecting electrons into the electrolyte so as to improve a flow characteristic through the ion transport channels.

3. The method of claim 1 further comprising injecting a number of electrons into the electrolyte that is no more than a number of ions in the electrolyte.

4. A method of recovering performance of a degraded solar cell having first and second electrodes, the degraded solar cell having ions accumulated in an electrolyte of the solar cell so as to block ion transport channels of the electrolyte, the method comprising:
   connecting a power source to first and second electrodes;
   sequentially applying a series of voltage pulses with the power source across the solar cell for forward electrical biasing of the solar cell, each voltage pulse:
   spaced from an adjacent voltage pulse by a time period, the time period being in a range of 1 second to 3 seconds; and
   defined by a pulse height of between about 2 V and 3 V and a pulse width of between about 150 ms and 200 ms;
   injecting electrons into the electrolyte during application of each voltage pulse; and
   redistributing the ions by moving at least some of the ions so as to improve a flow characteristic through the ion transport channels.

5. The method of claim 4 wherein redistributing the ions includes changing a concentration of ions in the electrolyte.

6. The method of claim 4 further comprising injecting a number of electrons into the electrolyte that is no more than a number of ions in the electrolyte.

* * * * *